US012785638B2

(12) United States Patent
Manlove et al.

(10) Patent No.: US 12,785,638 B2
(45) Date of Patent: Nov. 3, 2026

(54) BIDIRECTIONAL INTEGRATED LOW TEMPERATURE COEFFICIENT CURRENT SENSOR

(71) Applicant: Analog Devices, Inc., Wilmington, MA (US)

(72) Inventors: Gregory J. Manlove, Colorado Springs, CO (US); Eric A. Sagen, Colorado Springs, CO (US)

(73) Assignee: Analog Devices, Inc., Wilmington, MA (US)

( * ) Notice: Subject to any disclaimer, the term of this patent is extended or adjusted under 35 U.S.C. 154(b) by 432 days.

(21) Appl. No.: 18/498,702

(22) Filed: Oct. 31, 2023

(65) Prior Publication Data

US 2025/0141416 A1 May 1, 2025

(51) Int. Cl.

| | |
|---|---|
| ***H03F 3/45*** | (2006.01) |
| ***H03F 1/32*** | (2006.01) |
| ***H03G 3/00*** | (2006.01) |
| ***H03M 1/74*** | (2006.01) |

(52) U.S. Cl.

CPC ....... *H03F 3/45475* (2013.01); *H03F 1/3211* (2013.01); *H03G 3/001* (2013.01); *H03M 1/742* (2013.01); *H03F 2200/261* (2013.01)

(58) Field of Classification Search

CPC ............... H03F 3/45475; H03F 1/3211; H03F 2200/261; H03G 3/001; H03M 1/742; G01R 19/00; G01R 19/25; G01R 19/165

USPC .......................................................... 330/254

See application file for complete search history.

(56) References Cited

U.S. PATENT DOCUMENTS

| | | | | |
|---|---|---|---|---|
| 5,498,984 | A * | 3/1996 | Schaffer ................ | H03F 3/3066 327/51 |
| 8,278,909 | B2 | 10/2012 | Fletcher | |
| 11,378,595 | B2 | 7/2022 | Petersen et al. | |
| 2007/0115009 | A1 | 5/2007 | Graefling | |
| 2011/0291741 | A1 | 12/2011 | Mayer et al. | |
| 2012/0218022 | A1 | 8/2012 | Lazarov et al. | |
| 2013/0054155 | A1 | 2/2013 | Jiang et al. | |

(Continued)

FOREIGN PATENT DOCUMENTS

| | | |
|---|---|---|
| KR | 101117611 | 3/2012 |
| TW | I440859 | 6/2014 |

(Continued)

OTHER PUBLICATIONS

"U.S. Appl. No. 18/498,731, Non Final Office Action mailed Jul. 22, 2025", 19 pgs.

(Continued)

*Primary Examiner* — Hafizur Rahman

(74) *Attorney, Agent, or Firm* — Schwegman Lundberg & Woessner, P.A.

(57) ABSTRACT

This disclosure describes various bidirectional current sensing techniques. The solution described utilizes a matched thermal substrate, e.g., copper, in conjunction with the front two amplifiers of a three amplifier instrumentation amplifier. The bidirectional system current sensor module described utilizes the matched thermal substrate approach to cancel out temperature coefficient dependency in the sensor. Behind the lead two amplifiers, the circuits can be varied to support factory gain trim and voltage or current mode type outputs.

20 Claims, 6 Drawing Sheets

(56) References Cited

U.S. PATENT DOCUMENTS

| | | | | |
|---|---|---|---|---|
| 2014/0266841 | A1 | 9/2014 | Mayer et al. | |
| 2015/0260760 | A1 | 9/2015 | Katakura et al. | |
| 2021/0382091 | A1 | 12/2021 | Petersen et al. | |
| 2022/0365112 | A1 | 11/2022 | Petersen et al. | |
| 2024/0061025 | A1* | 2/2024 | Angelini ................ | G01R 1/203 |
| 2025/0138060 | A1 | 5/2025 | Sagen et al. | |

FOREIGN PATENT DOCUMENTS

| | | |
|---|---|---|
| TW | 202033970 | 9/2020 |
| TW | I791919 | 2/2023 |
| WO | 2020096840 | 5/2020 |

OTHER PUBLICATIONS

"U.S. Appl. No. 18/498,731, Response filed Oct. 10, 2025 to Non Final Office Action mailed Jul. 22, 2025", 12 pgs.

Martin, Drinovsky, "High Voltage Coil Current Sensor for DC-DC Converters Employing DDCC", Radioengineering 24, No. 4 (2015): 989, (Dec. 31, 2015).

Regan, Tim, "Current Sense Circuit Collection", Making Sense of Current (2005), (Dec. 31, 2005).

* cited by examiner

BIDIRECTIONAL INTEGRATED LOW TEMPERATURE COEFFICIENT CURRENT SENSOR

FIELD OF THE DISCLOSURE

This document pertains generally, but not by way of limitation, to an electrical current sensor, and more particularly, but not by way of limitation, to a laminate-based "zero" temperature coefficient current sensor.

BACKGROUND

Sensing large currents on a printed circuit board (PCB), such as can be found at the 12V DC input to a server or network switch, can require using a sense element that is capable of passing large currents safely and with minimal power loss. For sensing input currents in excess of 100 amperes, a sense element resistance on the order of 150 μΩ or less may be needed. Such a sense element can come in the form of a discrete sense resistor, such as can be soldered to the PCB, or even a resistor formed by the resistance of a PCB trace itself. The voltage developed across the sense resistance can be measured using various techniques such as an analog-to-digital converter (ADC) in the system, which can be further conditioned or signal-processed to produce a value indicating the sensed current (e.g., in Amperes) representing the current through the sense element.

Discrete sense resistors having low temperature coefficients tend to be made from exotic materials, such as iron-chrome or manganese-copper alloys. These exotic materials can achieve a low temperature coefficient of resistance (TCR) but can be expensive. Accurately sensing the voltage across such a sense resistor element can also be difficult, given the large current (resulting in ohmic "IR" voltage drops across the PCB) and a small voltage drop across the sense resistor being used as the current sense element, as is needed to maintain a reasonable power dissipation in the sense resistor. Some Kelvin-sense resistors are available, such as can include sense points integrated into the sense resistor, but these tend to be even more expensive.

Another way of sensing large currents is by using a section of a copper PCB trace itself as the current sense element. This has the advantage that the PCB trace already exists on the PCB and no additional voltage drops (such as due to a discrete sense element) need to be introduced. However, copper has a large TCR (3900 ppm/° C.). Thus, as the PCB changes temperature, either due to ambient temperature changes or due to the power dissipation from the IR drop across the copper trace, the absolute resistance of the sense element will change. While this effect can be compensated, such as by using a temperature sensor near the sense element and some analog or digital signal conditioning in the measurement circuitry, such temperature compensation involves additional complexity.

Furthermore, the accuracy of a discrete current sense resistor, or the thickness and width of the PCB trace, may not be controlled well enough to achieve the desired final system accuracy. Trim techniques can be applied to the final PCB assembly, but this adds test cost and complexity to the PCB manufacturing process, assuming that the current can be externally measured or applied accurately enough to achieve the desired trim target.

SUMMARY OF THE DISCLOSURE

This disclosure describes various bidirectional current sensing techniques. The solution described in this disclosure utilizes a matched thermal substrate, e.g., copper, in conjunction with the front two amplifiers of a three amplifier instrumentation amplifier. The bidirectional system current sensor module described utilizes the matched thermal substrate approach to cancel out temperature coefficient dependency in the sensor. Behind the lead two amplifiers, the circuits can be varied to support factory gain trim and voltage or current mode type outputs.

In some aspects, this disclosure is directed to a bidirectional system current sensor module comprising: an input node, a first output node, a second output node, and a system current monitor node; a first output transistor coupled between the input node and the first output node; a second output transistor coupled between the system current monitor node and the second output node; a first resistor coupled between the input node and the system current monitor node; a second resistor coupled between the input node and the first output transistor; a third resistor coupled between the system current monitor node and the second output transistor; a first amplifier, including a first amplifier input coupled to the second resistor, a second amplifier input coupled to an output node of a first trim circuit, and an amplifier output coupled to a control node of the first output transistor; and a second amplifier, including a first amplifier input coupled to the third resistor, a second amplifier input coupled to an output node of a second trim circuit, and an amplifier output coupled to a control node of the second output transistor, wherein the first output node and the second output node are configured to generate a differential output monitor current.

In some aspects, this disclosure is directed to a method of sensing or measuring a bidirectional system load current comprising: in response to a system load current flowing in a first direction between an input node and a system current monitor node via a first resistor, shunting a first output monitor current via a second resistor; adjusting, using a first trim circuit coupled across and in parallel with the first resistor, a gain between the input node and the system current monitor node; and controlling, using a first amplifier that is configured in a closed feedback loop, the first output monitor current in a manner that tends to reduce or minimize a voltage difference across first and second inputs of the first amplifier; and in response to the system load current flowing in a direction opposite the first direction between the input node and the system current monitor node via the first resistor, shunting a second output monitor current via a third resistor; adjusting, using a second trim circuit coupled across and in parallel with the first resistor, a signal between the input node and the system current monitor node; and controlling, using a second amplifier that is configured in a closed feedback loop, the second output monitor current in a manner that tends to reduce or minimize a voltage difference across first and second inputs of the second amplifier.

In some aspects, this disclosure is directed to a bidirectional system current sensor module comprising: an input node, a first output node, a second output node, and a system current monitor node; a first resistor coupled between the input node and the system current monitor node, wherein the first resistor has a first node and a second node; a first output transistor coupled between the system current monitor node and the first output node; a second output transistor coupled between the system current monitor node and the second output node; a second resistor coupled between the first output transistor and the second output transistor; and an amplifier including: a first amplifier input coupled to an output node of a first trim circuit, and a first amplifier output coupled to a control node of the first output transistor; a second amplifier input coupled to an output node of a second trim circuit, and a second amplifier output coupled to a control node of the second output transistor, wherein the first output node and the second output node are configured to generate a differential output monitor current.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Traditional current sensor control loops utilize a gain trim term in the denominator. The present inventors have recognized that the gain trim term in the denominator creates a non-linear relationship with respect to the trim code. This non-linear relationship requires high resolution digital-to-analog converters (DACs) to finely tune the gain adjustment. High resolution DACs increase cost and power consumption.

The present inventors have recognized that by moving the gain trim term from the denominator to the numerator, a linear relationship is created with respect to the trim code. This linear relationship reduces the dynamic range needed for the DAC, which allows the use of lower resolution DACs to smoothly adjust the gain while maintaining stability and accuracy.

In addition, the present inventors have also recognized the desirability of a system current sensor module that has bidirectional capabilities. Bidirectional current sensing is typically implemented using an instrumentation amplifier with a single current sense resistor. However, a single current sense resistor for high current typically has a poor temperature coefficient and poor process variation. The solution described in this disclosure utilizes a matched thermal substrate, e.g., copper, in conjunction with the front two amplifiers of a three amplifier instrumentation amplifier. The bidirectional system current sensor module described utilizes the matched thermal substrate approach to cancel out temperature coefficient dependency in the sensor. Behind the lead two amplifiers, the circuits can be varied to support factory gain trim and voltage or current mode type outputs.

Figure 1:
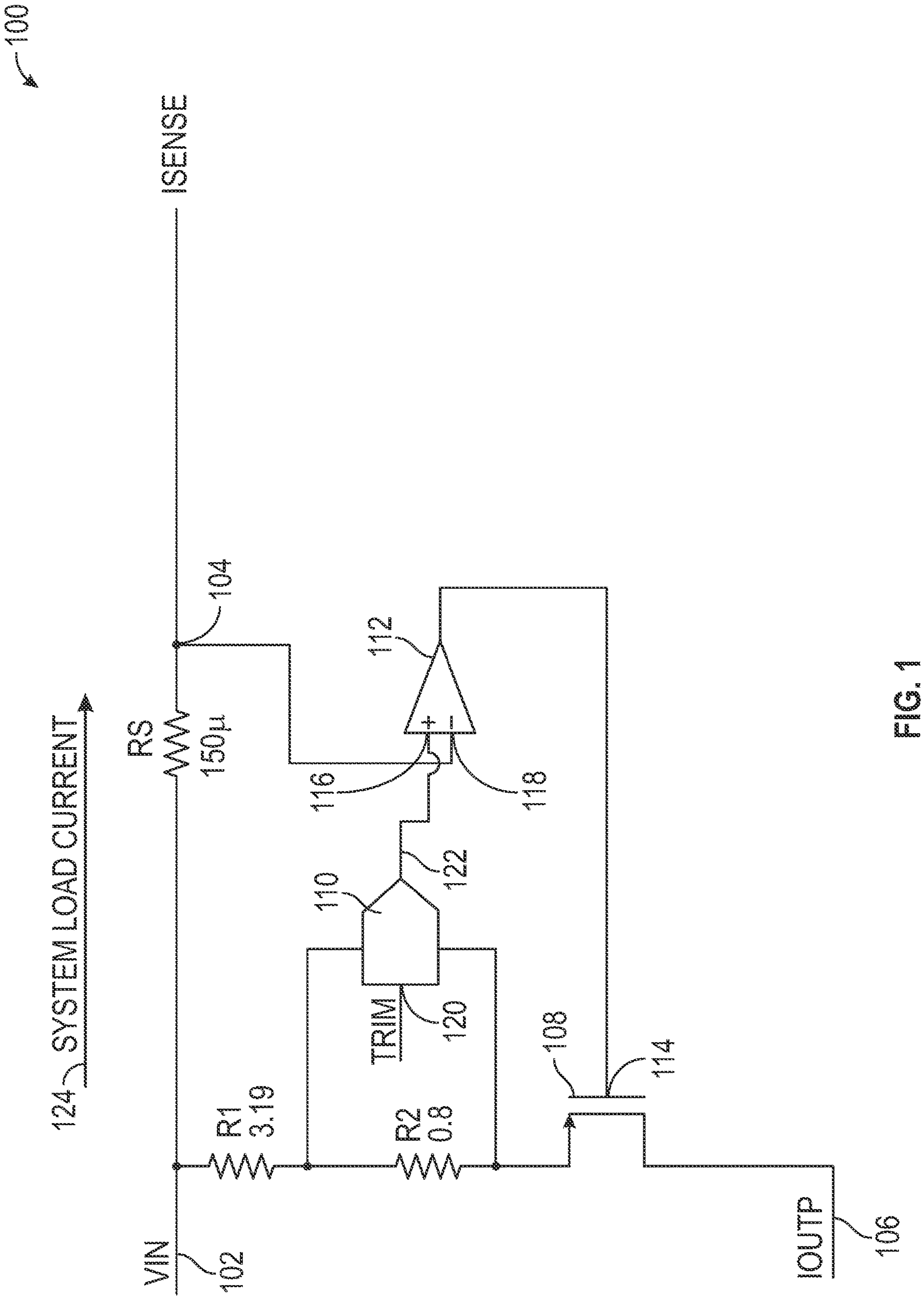
FIG. 1 shows an example of a system current sensor module architecture.

FIG. 1 shows an example of a system current sensor module 100 architecture. The system current sensor module 100 includes an input node 102 to receive an input voltage VIN, a system current monitor node 104 at which an output monitor current ISENSE can be monitored, and an output node 106 at which an output monitor current IOUTP is generated.

A current "sense" resistive element RS is between the input node 102 and the system current monitor node 104, such as having a resistance value of about 150 μΩ, can serve as the primary current sense element. The large "system load current" 124 from the system flows through this current sense resistor RS.

Gain setting resistive elements R1 (e.g., 3.19Ω) and R2 (e.g., 0.8Ω) are connected in series between the input node 102 and the output transistor 108. As seen in FIG. 1, a trim circuit 110 is coupled in parallel with the resistive element R2. The trim circuit 110 is configured to receive a trim code via a trim code input 120 and, in response, modify a voltage dependent on the VIN voltage at node 124, gain setting resistive elements R1 and R2 and the sensor output current flow through transistor 114.

The output 122 of the trim circuit 110 is coupled to a non-inverting (a first input 116) of the amplifier 112. The system current monitor node 104 is coupled to the inverting input (second input 118) of the amplifier 112. The output of the amplifier 112 is coupled to a control node 114 of the output transistor 108, e.g., a gate terminal of a field-effect transistor (FET). The amplifier 112 is configured in a closed feedback loop to control the output current IOUTP in a manner that tends to reduce or minimize a voltage difference across the first input 116 and the second input 118 of the amplifier 112.

The output monitor current IOUTP of the system current sensor module is given by Equation 1:

$$IOUTP = (IIN * RS)/(R1 + AV * R2) \quad \text{Equation 1}$$

where IOUTP is the output monitor current, IIN is the system load current, RS is the resistance of the resistive element RS, R1 is the resistance of the resistive element R1, AV is the gain trim term, and R2 is the resistance of the resistive element R2.

As seen in Equation 1, the gain trim term AV is in the denominator, which produces a non-linear gain relationship between IIN and IOUTP. The non-linear relationship complicates the trim algorithm because small changes in the error have large impacts on the adjust gain when the error is small, but smaller impacts when the error is large. This can require very high-resolution DACs to smoothly adjust the gain.

The present inventors have recognized the desirability of having the gain trim term in the numerator of the equation, which results in a linear relationship that can reduce or minimize the required trim resolution.

Figure 2:
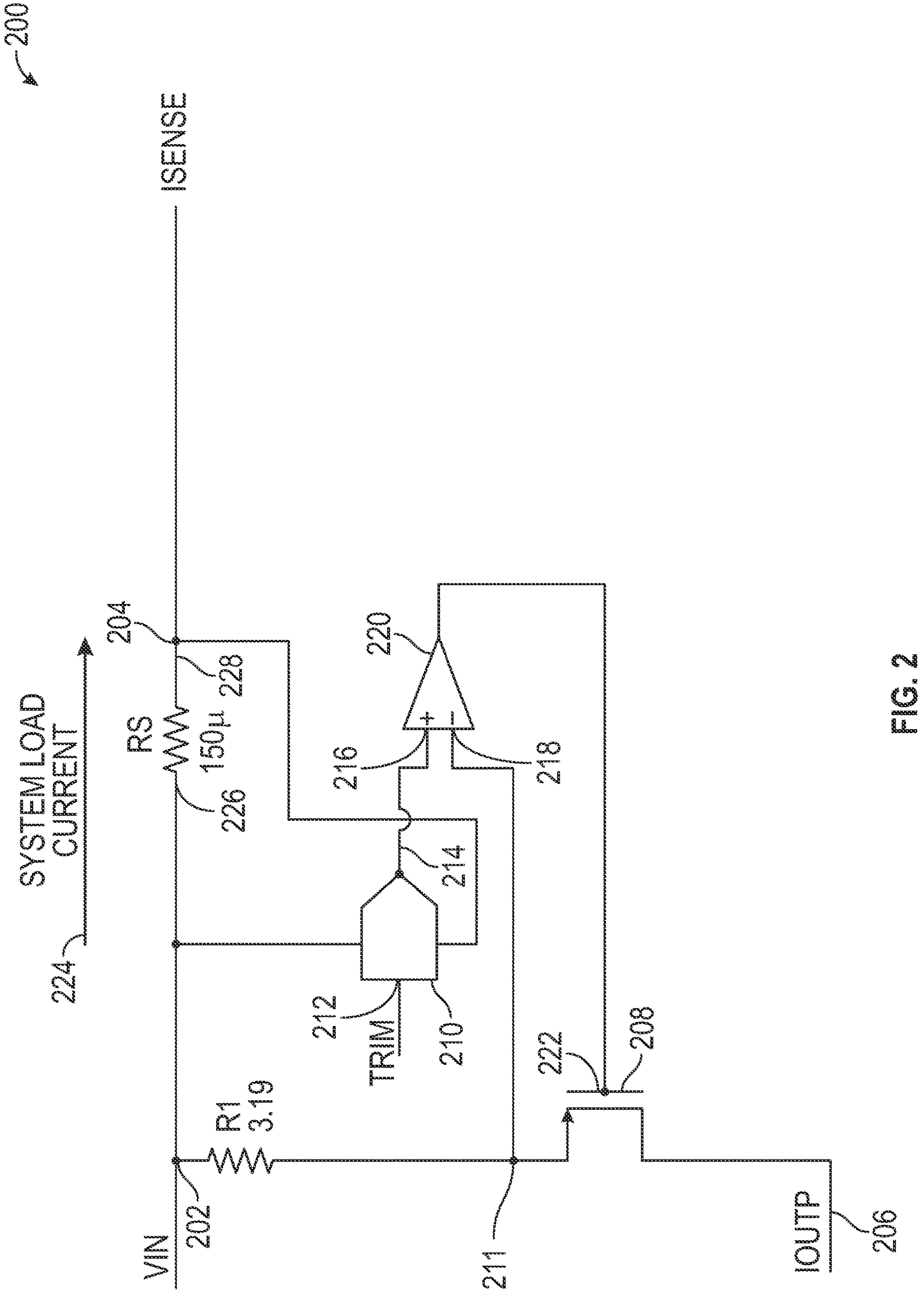
FIG. 2 shows an example of a linear system current sensor module architecture.

FIG. 2 shows an example of a linear system current sensor module 200 architecture. The system current sensor module 200 includes an input node 202 to receive an input voltage VIN, a system current monitor node 204 at which an output monitor current ISENSE can be monitored, and an output node 206 at which an output monitor current IOUTP is generated.

A current "sense" resistive element RS is between the input node 202 and the system current monitor node 204, such as having a resistance value of about 150 μΩ, can serve as the primary current sense element. The large "system load current" 224 from the system flows through this current sense resistor RS.

A gain setting resistive element R1 (e.g., 3.19Ω) is connected in series between the input node 202 and the output transistor 208. In contrast to the system current sensor module 100 in FIG. 1, a trim circuit 210 is coupled in parallel with the resistive element RS. The resistive element RS has a first node 226 and a second node 228, and the trim circuit 210 is coupled with the first node 226 and the second node 228.

The trim circuit 210 is configured to receive a trim code ("TRIM") via a trim code input 212 and, in response, modify a voltage between the input node 202 and the system current monitor node 204. For example, the trim circuit 210 can couple a resistance corresponding to the trim code in parallel with the resistive element RS to adjust the trim gain between a system load current 224 and an output monitor current.

In addition, using the techniques of this disclosure, the resistive element R2 of FIG. 1 has been eliminated, which simplifies the resistor network. By using these techniques, the gain term is now in the numerator of the equation, which results in a linear relationship that can reduce or minimize the required trim resolution.

The output monitor current IOUTP of the system current sensor module 200 is given by Equation 2:

$$IOUTP=(IIN*RS*AV)/R1 \quad \text{Equation 2}$$

where IOUTP is the output monitor current, IIN is the system load current, RS is the resistance of the resistive element RS, R1 is the resistance of the resistive element R1, and AV is the gain trim term.

The output 214 of the trim circuit 210 is coupled to a non-inverting (a first input 216) of the amplifier 220. The source of transistor 208 and resistor R1 node 211 is coupled to an inverting input (second input 218) of the amplifier 220. The output of the amplifier 220 is coupled to a control node 222 of the output transistor 208, e.g., a gate terminal of a FET. The amplifier 220 is configured in a closed feedback loop to control the output monitor current IOUTP in a manner that tends to reduce or minimize a voltage difference across the first input 216 and the second input 218 of the amplifier 220.

It can be helpful to keep the two resistors (e.g., the resistive element RS and the resistive element R1) at the same temperature, such as to help maintain a stable gain over temperature and to help reduce errors due to aging. Since the largest power dissipation will occur in the the resistive element RS (which can have the full, large, system current flowing through it), the resistive element R1 can be constructed so as to be thermally coupled to the resistive element RS, such that both of the resistive elements RS, R1 are at about the same temperature and experience the same temperature variations. This can include forming a "thermal cage" to help keep the resistive element RS and the resistive element R1 at the same temperature. As such, in some examples, the resistive element RS and the resistive element R1 are thermally coupled to keep a temperature of the second resistive element at or near a temperature of the first resistive element when a system load current is flowing through and heating the first resistor. Additional information can be found in commonly assigned U.S. Pat. No. 11,378,595 titled "Low temperature coefficient current sensor" to Michael D. Petersen et al., the entire contents of which being incorporated herein by reference.

In some examples, the resistive element RS and the resistive element R1 include the same material. For example, both the resistive element RS and the resistive element R1 can be copper.

In some examples, the trim circuit 210 can include a digital-to-analog converter.

Figure 3:
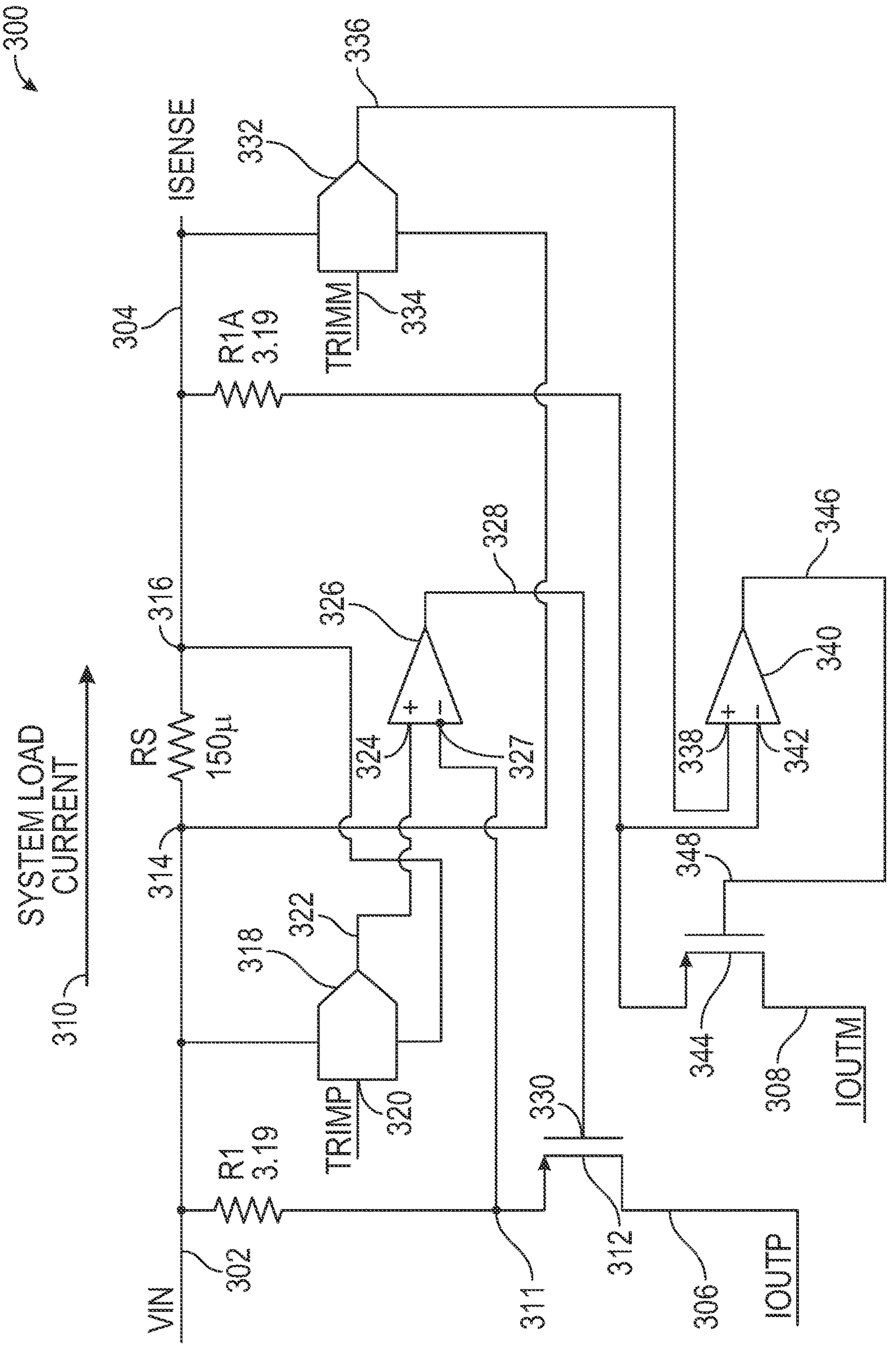
FIG. 3 shows an example of a linear bidirectional system current sensor module architecture using various techniques of this disclosure.

The present inventors have recognized the desirability of implementing the linear system current sensor module shown in FIG. 2 as a bidirectional current sensor, as shown in FIG. 3.

FIG. 3 shows an example of a linear bidirectional system current sensor module 300 architecture using various techniques of this disclosure. The bidirectional system current sensor module 300 includes an input node 302 to receive an input voltage VIN, a system current monitor node 304 at which an output monitor current ISENSE can be monitored, a first output node 306, and a second output node 308.

A current "sense" resistive element RS, e.g., a resistor, is between the input node 302 and the system current monitor node 304, such as having a resistance value of about 150 μΩ, and can serve as the primary current sense element. The large system load current 310 from the system flows through this current sense resistor RS.

A first gain setting resistive element R1 (e.g., 3.19Ω), e.g., a resistor, is connected in series between the input node 302 and the first output transistor 312. The resistive element RS has a first node 314 and a second node 316. A first trim circuit 318 is coupled with the first node 314 and the second node 316.

For system load current flowing in a first direction, such as from the input node 302 toward the system current monitor node 304, the first output monitor current IOUTP is shunted via the resistor R1. The first trim circuit 318 is configured to receive a first trim code ("TRIMP") via a trim code input 320 and, in response, modify a voltage between the input node 302 and the system current monitor node 304. For example, the first trim circuit 318 can couple a resistance corresponding to the first trim code in parallel with the resistive element RS to adjust the gain between the system load current 310 and a first output monitor current IOUTP.

The first output monitor current IOUTP is given by Equation 3:

$$IOUTP=(IIN*RS*Avp)/R1 \quad \text{Equation 3}$$

where IIN is the system load current 310, Avp is a forward current trim gain and is set with the first trim code TRIMP, RS is the value of the resistive element RS, R1 is the value of the resistive element R1, and IOUTP is 0 in reverse current.

The output 322 of the first trim circuit 318 is coupled to a non-inverting (a first amplifier input 324) of the amplifier 326. An inverting input (second input 327) of the amplifier 326 is coupled to a node 311 between the resistor R1 and the source terminal of the first output transistor 312. The output 328 of the amplifier 326 is coupled to a control node 330 of the first output transistor 312, e.g., a gate terminal of a FET. The amplifier 326 is configured in a closed feedback loop to control the first output monitor current IOUTP in a manner that tends to reduce or minimize a voltage difference across the first input 324 and the second input 327 of the amplifier 326.

So far, the description of the bidirectional system current sensor module 300 is similar to that of the unidirectional system current sensor module 200 of FIG. 2. To account for system load current flowing in a direction opposite the first direction, such as from the system current monitor node 304 to the input node 302, the bidirectional system current sensor module 300 can include additional circuitry.

A second gain setting resistive element R1A (e.g., 3.19Ω), e.g., a resistor, is connected in series between the system current monitor node 304 and the second output node 308. A second output monitor current IOUTM is shunted via the resistor R1A. Like the first trim circuit 318, a second trim circuit 332 is coupled with the first node 314 and the second node 316 of the resistive element RS. The second trim circuit 332 is configured to receive a second trim code ("TRIMM") via a trim code input 334 and, in response, modify a voltage between the input node 302 and the system current monitor node 304. For example, the second trim circuit 332 can couple a resistance corresponding to the second trim code in parallel with the resistive element RS to adjust the gain between the system load current 310 and the second output monitor current IOUTM.

The second output monitor current IOUTM is given by Equation 4:

$$IOUTM = (IIN * RS * Avm)/R1A \qquad \text{Equation 4}$$

where IIN is the system load current 310, Avm is a reverse current trim gain and is set with the second trim code TRIMM, RS is the value of the resistive element RS, R1A is the value of the resistive element R1A, and IOUTM is 0 in forward current.

The output 336 of the second trim circuit 332 is coupled a non-inverting (a first amplifier input 338) of the amplifier 340. An inverting input (a second amplifier input 342) of the amplifier 340 is coupled to a node between the resistor R1A and the source terminal of the second output transistor 344, e.g., a FET. The output 346 of the amplifier 340 is coupled to a control node 348 of the second output transistor 344. The amplifier 340 is configured in a closed feedback loop to control the second output monitor current IOUTM in a manner that tend to reduce or minimize a voltage difference across the first amplifier input 338 and the second amplifier input 342 of the amplifier 340. With the bidirectional techniques of this disclosure, the first output node 306 and the second output node 308 are configured to generate a differential output monitor current.

In some examples, each of the first trim circuit 318 and the second trim circuit 332 includes a corresponding digital-to-analog converter. In some examples, the digital-to-analog converter includes a voltage digital-to-analog converter, such as an R-2R digital-to-analog converter.

It can be helpful to keep the three resistors (e.g., the resistive element RS, the resistive element R1, and the resistive element R1A) at the same temperature, such as to help maintain a stable gain over temperature and to help reduce errors due to aging. Since the largest power dissipation will occur in the resistive element RS (which can have the full, large, system load current 310 flowing through it), the resistive elements R1 and R1A can be constructed so as to be thermally coupled to the resistive element RS, such that these three resistive elements RS, R1, R1A are at about the same temperature and experience the same temperature variations. This can include forming a "thermal cage" to help keep the resistive elements RS, R1, and R1A at the same temperature. As such, in some examples, the first resistor RS, the second resistor R1, and the third resistor R1A are thermally coupled to keep a temperature of the second resistor and the third resistor at or near a temperature of the first resistor when a system load current 310 is flowing through the first resistor and heating the first resistor. Additional information can be found in commonly assigned U.S. Pat. No. 11,378,595 titled "Low temperature coefficient current sensor" to Michael D. Petersen et al., the entire contents of which being incorporated herein by reference.

In some examples, the resistive elements RS, R1, and R1A include the same material. For example, both the resistive elements RS, R1, and R1A can be copper.

Figure 4:
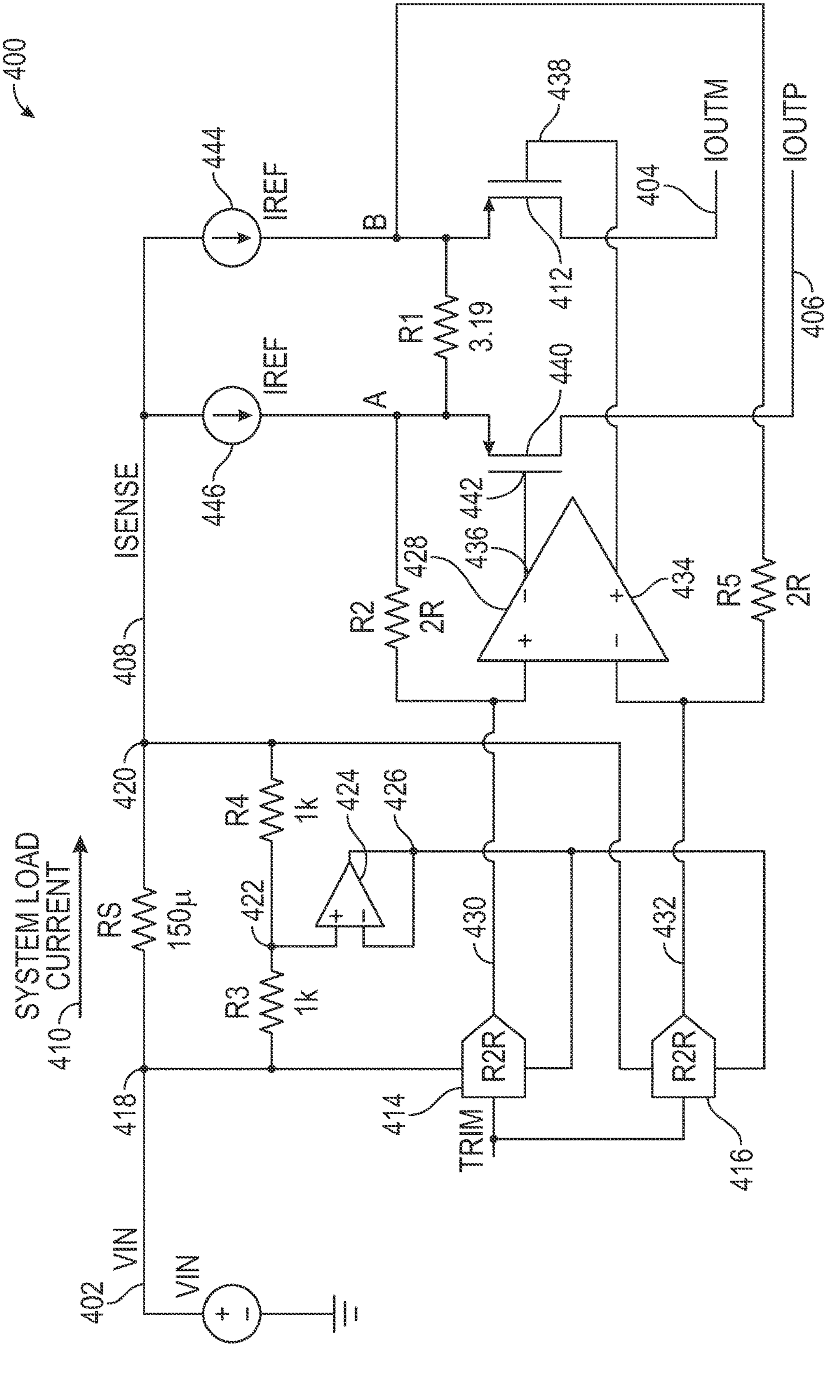
FIG. 4 shows another example of a bidirectional system current sensor module architecture using various techniques of this disclosure.

FIG. 4 shows another example of a bidirectional system current sensor module 400 architecture using various techniques of this disclosure. The bidirectional system current sensor module 400 includes an input node 402 to receive an input voltage VIN, a first output node 404, a second output node 406, and a system current monitor node 408. The first output node 404 and the second output node 406 are configured to generate a differential output monitor current.

A current "sense" resistive element RS, e.g., a resistor, is between the input node 402 and the system current monitor node 408, such as having a resistance value of about 150 μΩ, and can serve as the primary current sense element. The large system load current 410 from the system flows through this current sense resistor RS.

The bidirectional system current sensor module 400 includes a first trim circuit 414 and a second trim circuit 416. A trim code TRIM is applied to both the first trim circuit 414 and the second trim circuit 416 and, in response, the first trim circuit 414 and the second trim circuit 416 modify a voltage between the input node 402 and the system current monitor node 408 to produce a voltage proportional to the system load current across the resistor RS and the trim code, where a trim represented by the trim code provides a variable attenuation based on the trim code.

The first trim circuit 414 is coupled to receive a voltage of the first input node 402 and a voltage at a node between a first node 418 and the second node 420 of the resistive element RS. The second trim circuit 416 is coupled to receive the voltage at a node 422 between the first node 418 and the second node 420 and a voltage at the second node 420. For example, a resistor R3, e.g., 1 kΩ, and a resistor R4, e.g., 1 kΩ, are coupled in series, where the resistor RS is coupled in parallel with the series combination of the resistors R3 and R4. The node 422 is a node between the resistors R3 and R4.

In the example shown, the node 422 can be coupled to a first input, e.g., non-inverting input, of an amplifier 424. A second input, e.g., inverting input, of the amplifier 424 can be connected with an output of the amplifier 424 in a unity-gain buffer configuration. The output 426 can be applied to both the first trim circuit 414 and the second trim circuit 416.

The bidirectional system current sensor module 400 includes an amplifier 428, e.g., a differential amplifier. An output 430 of the first trim circuit 414 is coupled to a non-inverting input of the amplifier 428 and an output 432 of the second trim circuit 416 is coupled to an inverting input of the amplifier 428.

A first output 434 of the amplifier 428 is coupled to a first output transistor 412, e.g., a control node 438 of the first output transistor 412. A second output 436 of the amplifier 428 is coupled a second output transistor 440, e.g., a control node 442 of the second output transistor 440. The amplifier 428 is in a closed feedback loop configuration with a resistor R2 coupled to the non-inverting input and a resistor R5 coupled to the inverting input. Both resistors R2 and R5 can have a similar resistance of 2R, for example, where R equals the output resistance of a R2R voltage digital-to-analog converter. Each of the first trim circuit 414 and the second trim circuit 416 can include a corresponding digital-to-analog converter, such as a R2R voltage digital-to-analog converter.

The bidirectional system current sensor module 400 can include a first current source 444 coupled in series with the first output transistor 412 and configured to source a first reference current IREF, and a second current source 446 coupled in series with the second output transistor 440 and configured to source a second reference current IREF. A gain setting resistor R1 can be coupled between the first output transistor 412 and the second output transistor 440.

In operation, the feedback of the system drives amplifier input voltages 430 and 432 to be at near equal voltage resulting in a voltage proportional to the difference VIN−ISENSE appearing across the resistor R1. With the trim, VIN−ISENSE=Av*(B−A), where Av is the gain, B is voltage at node B, and A is the voltage at node A. If trim is 1, then VIN−ISENSE=B−A. Specifically, the voltage that appears across R1 is Av*(VIN−ISENSE) where Av is the trim gain parameter with a value between 0 and 1 where the value of Av is determined by the aforementioned trim code. This puts the current across R1 as $I_{(R1)}$=(VIN−ISENSE)*Av/R1, where VIN−ISENSE=ISENSE*RS, so $I_{(R1)}$=(ISENSE*Rs)*Av/R1.

For the choice of components as examples in FIG. 4, the first output node 404 generates a first system output monitor current given by Equation 5:

$$IOUTP = IREF + (IIN * RS * Av/R1) \quad \text{Equation 5}$$

where IREF is the current supplied by the first current source 444, IIN is the system load current 410, RS is the value of the resistor RS, Av is the trim gain, and R1 is the value of the resistor R1.

For the choice of components as examples chosen in FIG. 4, the second output node 406 generates a second system output monitor current IOUTM given by Equation 6:

$$IOUTM = IREF - (IIN * RS * Av/R1) \quad \text{Equation 6}$$

where IREF is the current supplied by the first current source 446, IIN is the system load current 410, RS is the value of the resistor RS, Av is the trim gain, and R1 is the value of the resistor R1. Taking the difference between the two outputs results in Equation 7:

$$IOUTP - IOUTM = 2 * IIN * Av * (R2/R1) \quad \text{Equation 7}$$

It can be helpful to keep the two resistors (e.g., the resistive element RS and the resistive element R1) at the same temperature, such as to help maintain a stable gain over temperature and to help reduce errors due to aging. Since the largest power dissipation will occur in the resistive element RS (which can have the full, large, system current flowing through it), the resistive element R1 can be constructed so as to be thermally coupled to the resistive element RS, such that both of the resistive elements RS, R1 are at about the same temperature and experience the same temperature variations. This can include forming a "thermal cage" to help keep the resistive element RS and the resistive element R1 at the same temperature. As such, in some examples, the resistive element RS and the resistive element R1 are thermally coupled to keep a temperature of the second resistive element at or near a temperature of the first resistive element when a system load current is flowing through and heating the first resistor. Additional information can be found in commonly assigned U.S. Pat. No. 11,378,595 titled "Low temperature coefficient current sensor" to Michael D. Petersen et al., the entire contents of which being incorporated herein by reference.

Figure 5:
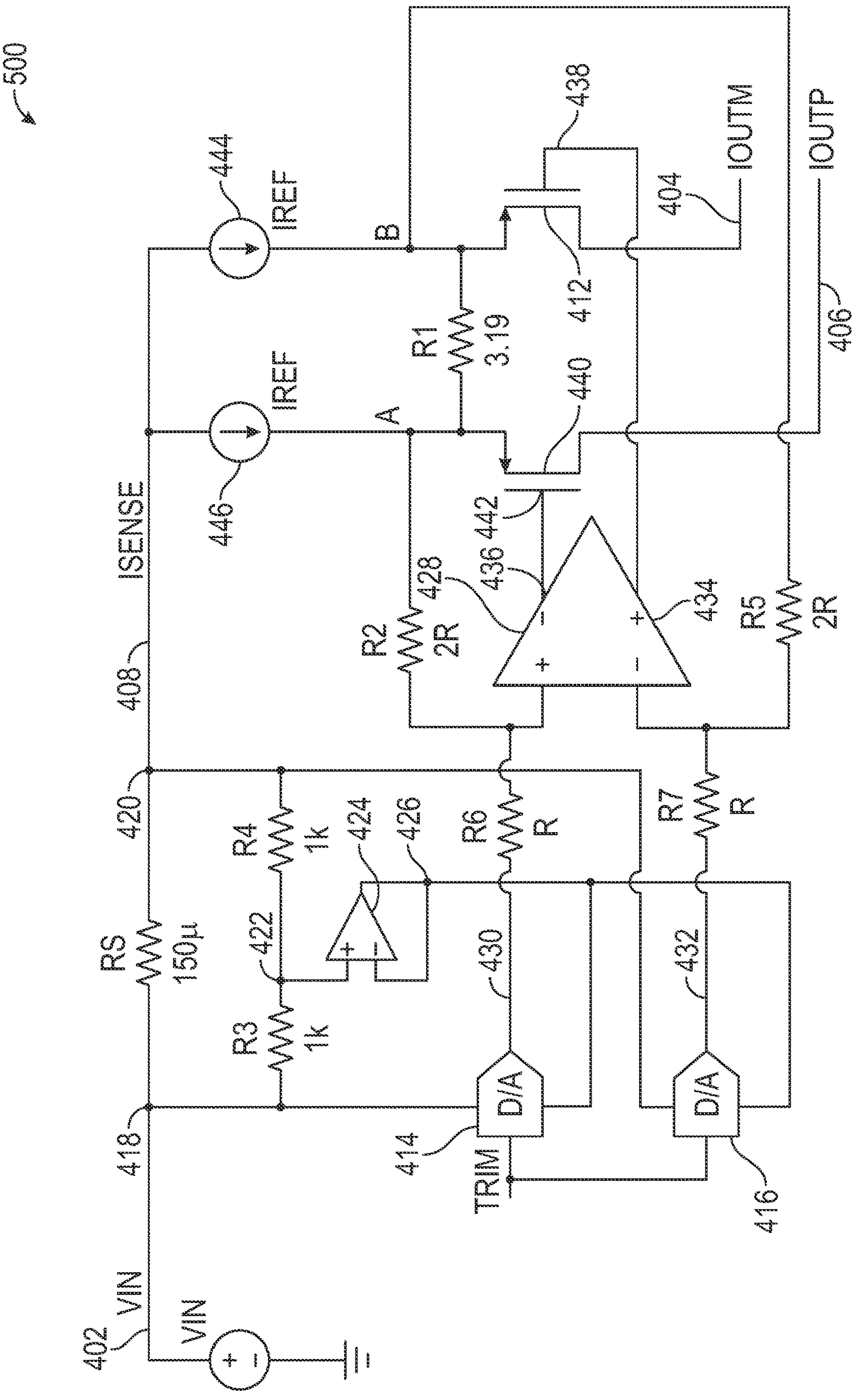
FIG. 5 shows another example of a bidirectional system current sensor module architecture using various techniques of this disclosure.

FIG. 5 shows another example of a bidirectional system current sensor module 500 architecture using various techniques of this disclosure. Many of the components in the bidirectional system current sensor module 500 are similar to the bidirectional system current sensor module 400 of FIG. 4 and, for brevity, will not be described in detail again.

Instead of the specifically showing an R2R voltage digital-to-analog converter, as in FIG. 4, the bidirectional system current sensor module 500 depicts the first trim circuit 414 and the second trim circuit 416 as comprising of a digital-to-analog converter with a low output impedance (versus an R2R digital to analog converter that has an output impedance of R). As seen in FIG. 5, a resistor R6 (having resistance R) is coupled between the output 430 of the first trim circuit 414 and the non-inverting input of the amplifier 428, and a resistor R7 (such as having a resistance R) is coupled between the output 432 of the second trim circuit 416 and the inverting input of the amplifier 428.

Figure 6:
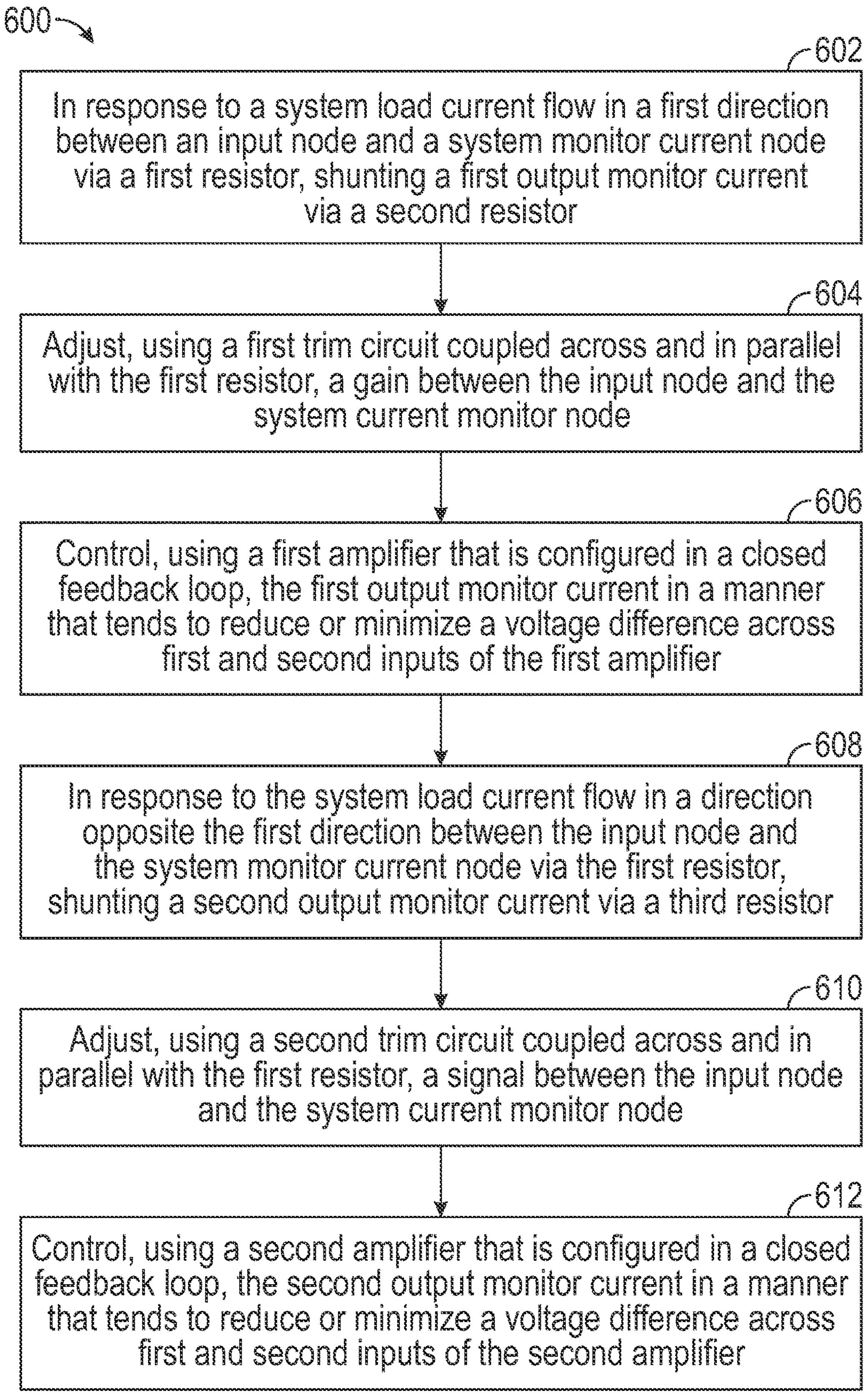
FIG. 6 is a flow diagram of an example of a method of sensing or measuring a bidirectional system load current.

FIG. 6 is a flow diagram of an example of a method 600 of sensing or measuring a bidirectional system load current. At block 602, the method 600 includes in response to a system load current flowing in a first direction between an input node and a system current monitor node via a first resistor, shunting a first output monitor current via a second resistor.

At block 604, the method 600 includes adjusting, using a first trim circuit coupled across and in parallel with the first resistor, a trim gain between the input node and the system current monitor node.

At block 606, the method 600 includes controlling, using a first amplifier that is configured in a closed feedback loop, the first output monitor current in a manner that tends to reduce or minimize a voltage difference across first and second inputs of the first amplifier.

At block 608, the method 600 includes in response to the system load current flowing in a direction opposite the first direction between the input node and the system current monitor node via the first resistor, shunting a second output monitor current via a third resistor.

At block 610, the method 600 includes adjusting, using a second trim circuit coupled across and in parallel with the first resistor, a signal between the input node and the system current monitor node.

In some examples, adjusting, using the first trim circuit coupled across and in parallel with the first resistor, the signal between the system load current and the system current monitor node includes receiving a first trim code and a second trim code and, in response, modifying a voltage between the input node and the system current monitor node to produce a voltage proportional to the system load current across the first resistor and the first trim code, wherein a trim represented by the first and second trim codes provides variable attenuation based on the first and second trim codes. In some examples, adjusting, using the first and second trim circuits coupled across and in parallel with the first resistor, the signal between the input node and the system current monitor nodes includes using a digital-to-analog converter to modify a resistance of a variable resistance coupled across and in parallel with the first resistor.

At block 612, the method 600 includes controlling, using a second amplifier that is configured in a closed feedback loop, the second output monitor current in a manner that tends to reduce or minimize a voltage difference across first and second inputs of the second amplifier.

In some examples, the method 600 includes thermally coupling the first resistor and the second and third resistors to keep a temperature of the second and third resistors at or near a temperature of the first resistor when a system load current is flowing through the first resistor and heating the first resistor.

In some examples, the method 600 includes modifying or blowing at least one polysilicon fuse.

Various Notes

Each of the non-limiting claims or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more claims thereof), either with respect to a particular example (or one or more claims thereof), or with respect to other examples (or one or more claims thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more claims thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

What is claimed is:

1. A bidirectional system current sensor module comprising:

an input node, a first output node, a second output node, and a system current monitor node;

a first output transistor coupled between the input node and the first output node;

a second output transistor coupled between the system current monitor node and the second output node;

a first resistor coupled between the input node and the system current monitor node;

a second resistor coupled between the input node and the first output transistor;

a third resistor coupled between the system current monitor node and the second output transistor;

a first amplifier, including a first amplifier input coupled to the second resistor, a second amplifier input coupled to an output node of a first trim circuit, and an amplifier output coupled to a control node of the first output transistor; and a second amplifier, including a first amplifier input coupled to the third resistor, a second amplifier input coupled to an output node of a second trim circuit, and an amplifier output coupled to a control node of the second output transistor, wherein the first output node and the second output node are configured to generate a differential output monitor current.

2. The bidirectional system current sensor module of claim 1, wherein the first resistor, the second resistor, and the third resistor are thermally coupled to keep a temperature of the second resistor and the third resistor at or near a temperature of the first resistor when a system current is flowing through the first resistor and heating the first resistor.

3. The bidirectional system current sensor module of claim 1, wherein the first resistor, the second resistor, and the third resistor include the same material.

4. The bidirectional system current sensor module of claim 1, wherein, when current is flowing in a first direction, the first trim circuit is configured to receive a first trim code and, in response, couple a corresponding resistance in parallel with the first resistor to adjust a gain between a system load current and a first output monitor current, and wherein, when current is flowing opposite the first direction, the second trim circuit is configured to receive a second trim code and, in response, couple a corresponding resistance in parallel with the first resistor to adjust a gain between the system load current and a second output monitor current.

5. The bidirectional system current sensor module of claim 1, wherein each of the first trim circuit and the second trim circuit includes a corresponding digital-to-analog converter.

6. The bidirectional system current sensor module of claim 5, wherein the digital-to-analog converter includes a voltage digital-to-analog converter.

7. The bidirectional system current sensor module of claim 6, wherein the voltage digital-to-analog converter includes a R-2R digital-to-analog converter.

8. The bidirectional system current sensor module of claim 1, wherein the first resistor has a first node and a second node, and wherein the first trim circuit is coupled with the first node and the second node, and wherein the second trim circuit is coupled with the first node and the second node.

9. A method of sensing or measuring a bidirectional system load current comprising:

in response to a system load current flowing in a first direction between an input node and a system current monitor node via a first resistor, shunting a first output monitor current via a second resistor;

adjusting, using a first trim circuit coupled across and in parallel with the first resistor, a gain between the input node and the system current monitor node; and controlling, using a first amplifier that is configured in a closed feedback loop, the first output monitor current in a manner that tends to reduce or minimize a voltage difference across first and second inputs of the first amplifier; and in response to the system load current flowing in a direction opposite the first direction between the input node and the system current monitor node via the first resistor, shunting a second output monitor current via a third resistor;

adjusting, using a second trim circuit coupled across and in parallel with the first resistor, a signal between the input node and the system current monitor node; and controlling, using a second amplifier that is configured in a closed feedback loop, the second output monitor current in a manner that tends to reduce or minimize a voltage difference across first and second inputs of the second amplifier.

10. The method of claim 9, comprising:

thermally coupling the first resistor, the second resistor, and a third resistor to keep a temperature of the second and third resistors at or near a temperature of the first resistor when a system load current is flowing through the first resistor and heating the first resistor.

11. The method of claim 9, wherein adjusting, using the first and second trim circuits coupled across and in parallel with the first resistor, the signal between the system load current and the system current monitor node includes:

receiving a first trim code and a second trim code and, in response, modifying a voltage between the input node and the system current monitor node to produce a voltage proportional to the system load current across the first resistor and the first trim code, wherein a trim represented by the first and second trim codes provides variable attenuation based on the first and second trim codes.

12. The method of claim 11, wherein adjusting, using the first and second trim circuits coupled across and in parallel with the first resistor, the signal between the input node and the system current monitor nodes includes:

using a digital-to-analog converter to modify a resistance of a variable resistance coupled across and in parallel with the first resistor.

13. A bidirectional system current sensor module comprising:

an input node, a first output node, a second output node, and a system current monitor node;

a first resistor coupled between the input node and the system current monitor node, wherein the first resistor has a first node and a second node;

a first output transistor coupled between the system current monitor node and the first output node;

a second output transistor coupled between the system current monitor node and the second output node;

a second resistor coupled between the first output transistor and the second output transistor; and an amplifier including:

a first amplifier input coupled to an output node of a first trim circuit, and a first amplifier output coupled to a control node of the first output transistor;

a second amplifier input coupled to an output node of a second trim circuit, and a second amplifier output coupled to a control node of the second output transistor, wherein the first output node and the second output node are configured to generate a differential output monitor current.

14. The bidirectional system current sensor module of claim 13, comprising:

the first trim circuit coupled to receive a voltage of the first node and a voltage at a node between the first node and the second node; and the second trim circuit coupled to receive the voltage at the node between the first node and the second node and a voltage at the second node.

15. The bidirectional system current sensor module of claim 13, comprising:

a third resistor and a fourth resistor coupled in series, wherein the first resistor is coupled in parallel with a series combination of the third resistor and the fourth resistor, and wherein the node between the first node and the second node is a node between the third resistor and the fourth resistor.

16. The bidirectional system current sensor module of claim 13, comprising:

a first current source coupled in series with the first output transistor and configured to source a first reference current; and a second current source coupled in series with the second output transistor and configured to source a second reference current.

17. The bidirectional system current sensor module of claim 13, wherein each of the first trim circuit and the second trim circuit includes a corresponding digital-to-analog converter.

18. The bidirectional system current sensor module of claim 17, wherein the digital-to-analog converter includes a voltage digital-to-analog converter.

19. The bidirectional system current sensor module of claim 18, wherein the voltage digital-to-analog converter includes a R-2R digital-to-analog converter.

20. The bidirectional system current sensor module of claim 13, wherein the first resistor and the second resistor are thermally coupled, and wherein the first resistor and the second resistor include the same material.

* * * * *